United States Patent
Levy

(10) Patent No.: US 8,067,284 B1
(45) Date of Patent: Nov. 29, 2011

(54) OXYNITRIDE BILAYER FORMED USING A PRECURSOR INDUCING A HIGH CHARGE TRAP DENSITY IN A TOP LAYER OF THE BILAYER

(75) Inventor: Sagy Levy, Zichron Yoakov (IL)

(73) Assignee: Cypress Semiconductor Corporation, San Jose, CA (US)

( * ) Notice: Subject to any disclaimer, the term of this patent is extended or adjusted under 35 U.S.C. 154(b) by 478 days.

(21) Appl. No.: 12/006,961

(22) Filed: Jan. 8, 2008

Related U.S. Application Data

(60) Provisional application No. 60/931,948, filed on May 25, 2007.

(51) Int. Cl.
*H01L 21/336* (2006.01)

(52) U.S. Cl. .............. 438/258; 438/303; 257/E21.626

(58) Field of Classification Search ............ 438/110, 438/258, 303; 257/E21.626
See application file for complete search history.

(56) References Cited

U.S. PATENT DOCUMENTS

| | | | |
|---|---|---|---|
| 4,490,900 A | 1/1985 | Chiu | |
| 5,464,783 A | 11/1995 | Kim et al. | |
| 5,972,765 A | 10/1999 | Clark et al. | |
| 6,020,606 A | 2/2000 | Liao | |
| 6,023,093 A | 2/2000 | Gregor et al. | |
| 6,114,734 A | 9/2000 | Eklund | |
| 6,140,187 A | 10/2000 | DeBusk et al. | |
| 6,147,014 A | 11/2000 | Lyding et al. | |
| 6,297,173 B1 | 10/2001 | Tobin et al. | |
| 6,348,380 B1 | 2/2002 | Weimer et al. | |
| 6,406,960 B1 | 6/2002 | Hopper et al. | |
| 6,445,030 B1 | 9/2002 | Wu et al. | |
| 6,661,065 B2 | 12/2003 | Kunikiyo | |
| 6,677,213 B1 | 1/2004 | Ramkumar et al. | |
| 6,709,928 B1 | 3/2004 | Jenne et al. | |
| 7,018,868 B1* | 3/2006 | Yang et al. ............ | 438/258 |
| 7,042,054 B1 | 5/2006 | Ramkumar et al. | |
| 7,482,236 B2* | 1/2009 | Lee et al. ............ | 438/303 |
| 2009/0179253 A1* | 7/2009 | Levy et al. ............ | 257/324 |

OTHER PUBLICATIONS

Ohring, M., Materials Science of Thin Films, 2nd ed. Academic, 2002, pp. 336-337; 4 pages.
USPTO Advisory Action for U.S. Appl. No. 11/811,958 dated Jun. 2, 2011; 5 pages.
USPTO Final Rejection for U.S. Appl. No. 11/811,958 dated Mar. 15, 2011; 13 pages.
USPTO Notice of Allowance for U.S. Appl. No. 09/920,378 dated Nov. 10, 2003; 5 pages.
USPTO Advisory Action for U.S. Appl. No. 09/920,378 dated Sep. 5, 2003; 3 pages.
USPTO Advisory Action for U.S. Appl. No. 09/920,378 dated Jun. 25, 2003; 3 pages.
USPTO Final Rejection for U.S. Appl. No. 09/920,378 dated Mar. 28, 2003; 6 pages.
USPTO Non-Final Rejection for U.S. Appl. No. 09/920,378 dated Oct. 21, 2002; 10 pages.

(Continued)

*Primary Examiner* — Walter L Lindsay, Jr.

(57) ABSTRACT

A semiconductor device including a bilayer charge storing layer and methods of forming the same are provided. Generally, the method includes: (i) forming a first layer of the bilayer charge storing layer; and (ii) forming a second layer formed on a surface of the first layer, the second layer including an oxynitride charge trapping layer. Preferably, the first layer includes a substantially trap free oxynitride layer. More preferably, the oxynitride charge trapping layer includes a significantly higher stoichiometric composition of silicon than that of the first layer. In certain embodiments, the oxynitride charge trapping layer has a concentration of carbon selected to increase the number of traps therein. Other embodiments are also disclosed.

17 Claims, 5 Drawing Sheets

OTHER PUBLICATIONS

USPTO Restriction Requirement for U.S. Appl. No. 09/920,378 dated Jul. 22, 2002; 4 pages.
USPTO Notice of Allowance for U.S. Appl. No. 10/740,205 dated Jun. 15, 2005; 6 pages.
USPTO Final Rejection for U.S. Appl. No. 10/740,205 dated Mar. 22, 2005; 8 pages.
USPTO Non-Final Rejection for U.S. Appl. No. 10/740,205 dated Jun. 29, 2004; 5 pages.
USPTO Non-Final Rejection for U.S. Appl. No. 11/811,958 dated Oct. 7, 2010; 12 pages.
USPTO Advisory Action for U.S. Appl. No. 11/811,958 dated Apr. 20, 2010; 6 pages.
USPTO Advisory Action for U.S. Appl. No. 11/811,958 dated Mar. 16, 2010; 4 pages.
USPTO Final Rejection for U.S. Appl. No. 11/811,958 dated Jan. 6, 2010; 17 pages.
USPTO Non-Final Rejection for U.S. Appl. No. 11/811,958 dated May 13, 2009; 14 pages.

* cited by examiner

US 8,067,284 B1

OXYNITRIDE BILAYER FORMED USING A PRECURSOR INDUCING A HIGH CHARGE TRAP DENSITY IN A TOP LAYER OF THE BILAYER

CROSS-REFERENCE TO RELATED APPLICATIONS

The present application claims the benefit of priority under 35 U.S.C. 119(e) to U.S. Provisional Patent Application Ser. No. 60/931,948 entitled "SONOS Stack With Oxynitride Bilayer Made Of BTBAS And $NH_3$," filed May 25, 2007, which application is hereby incorporated by reference in its entirety.

TECHNICAL FIELD

This invention relates to semiconductor processing and, more particularly to an oxide-nitride-oxide (ONO) stack or structure including an oxynitride bilayer that exhibits improved charge storing for data retention and to methods of forming the same.

BACKGROUND OF THE INVENTION

Non-volatile semiconductor memories, such as a split gate flash memory, typically use a stacked floating gate type field effect transistors, in which electrons are induced into a floating gate of a memory cell to be programmed by biasing a control gate and grounding a body region of a substrate on which the memory cell is formed.

In particular, transistors used in semiconductor memories typically have an oxide-nitride-oxide (ONO) or silicon-oxide-nitride-oxide-silicon (SONOS) stack between the floating gate and control gate in which a single, homogenous nitride or oxynitride layer is used as either a charge storing or retention layer of the memory.

FIG. 1 is a partial cross-sectional view of an intermediate structure for a semiconductor device 100 comprising a SONOS gate stack or structure 102 including a conventional ONO stack 104 formed over a surface 106 of a silicon substrate 108 according to a conventional method. In addition, the device 100 typically further includes one or more diffusion regions 110, such as source and drain regions, aligned to the gate stack and separated by a channel region 112. Briefly, the SONOS structure 102 includes a poly-silicon (poly) gate layer 114 formed upon and in contact with the ONO stack 104. The poly gate 114 is separated or electrically isolated from the substrate 108 by the ONO stack 104. The ONO stack 104 generally includes a lower oxide layer 116, a nitride or oxynitride layer 118 which serves as a charge storing or memory layer for the device 100, and a top, high-temperature oxide (HTO) layer 120 overlying the nitride or oxynitride layer.

One problem with conventional ONO and SONOS structures 102 and methods of forming the same is the single, homogenous nitride or oxynitride layer 118 that is used as a charge retention or memory layer, and which can have poor or decreasing data retention over time, limiting the device 100 lifetime and/or its use in several applications due to leakage current through the layer. Referring to FIG. 2A, if the memory layer is silicon (Si) rich there is a large, initial window or difference between the programming voltage (VTP), represented by graph or line 202, and the erase voltage (VTE), represented by line 204, but the window collapse very rapidly in retention mode to an end of life (EOL 206) of about 1.E+07 seconds.

Referring to FIG. 2B, if on the other hand the memory layer is if a high quality nitride layer, that is one having a low stoichiometric concentration of Si, the rate of collapse of the window or Vt slope in retention mode is reduced, but the initial program-erase window is also reduced. Moreover, the slope of Vt in retention mode is still appreciably steep and the leakage path is not sufficiently minimized to significantly improve data retention, thus EOL 206 is only moderately improved.

Another problem with the conventional approach to forming an ONO structure is that when a pure oxide layer is used as a tunnel bottom oxide the oxide layer needs to be thin enough to allow the initial program-erase window to be large to support an end of life program-erase window sufficient to meet a specified minimum difference between VTP an VTE. On the other hand, a tunnel oxide layer that is too thin will limit the retention by creating a charge loss path from the memory layer to the substrate that is too small or short, resulting in a bigger or steeper slope of Vt in retention mode.

Accordingly, there is a need for a memory device including an ONO stack with an oxynitride layer as a memory layer that exhibits improved data retention and methods of forming the same. It is further desirable that ONO stack and method not adversely impact programming and erase speed.

SUMMARY OF THE INVENTION

The present invention provides a solution to these and other problems, and offers further advantages over conventional ONO stacks or memory layers and methods of forming the same.

In a first aspect, the present invention is directed to a method of forming a bilayer charge storing layer of a semiconductor device. In one embodiment, the method comprises the step of forming a first layer of the bilayer charge storing layer followed by forming a second layer formed on a surface of the first layer, the second layer including an oxynitride charge trapping layer. Preferably, the step of forming the first layer comprises the step of forming a first layer including a substantially trap free oxynitride layer, and the step of forming the second layer comprises the step of forming an oxynitride charge trapping layer having a higher stoichiometric composition of silicon than the oxynitride layer of the first layer. More preferably, the oxynitride charge trapping layer has a predetermined concentration of carbon selected to increase the number of traps therein. The oxynitride charge trapping layer can be formed, for example, in a chemical vapor deposition (CVD) process using a process gas comprising Bis-TertiaryButylAminoSilane (BTBAS).

In certain embodiments, the oxynitride charge trapping layer is formed in a CVD process using a process gas comprising BTBAS and further comprising ammonia ($NH_3$). The BTBAS and $NH_3$ are mixed at a predetermined ratio to provide a narrow band gap energy level in the oxynitride charge trapping layer. Optionally, the deposition of the oxynitride charge trapping layer can be followed by a thermal annealing step in an atmosphere comprising gases selected from the group consisting of nitrous oxide ($N_2O$), $NH_3$, and nitrogen oxide (NO).

In another embodiment, the method is directed to a method of forming an oxide-nitride-oxide (ONO) structure of a semiconductor device. Generally, the method includes steps of: (i) forming a first oxide layer of the ONO structure; (ii) forming a bilayer charge storing layer on a surface of the first oxide layer, the bilayer charge storing layer including a first layer including a substantially trap free oxynitride layer and a second layer formed on a surface of the first layer including an oxynitride charge trapping layer; and (iii) forming a second oxide layer of the ONO structure on a surface of the second layer. Preferably, the oxynitride charge trapping layer comprises a higher stoichiometric composition of silicon than the oxynitride layer of the first layer. More preferably, the step of forming the bilayer charge storing layer comprises the step of forming a trap free oxynitride layer and an oxynitride charge trapping layer having a predetermined ratio of thicknesses there between. The substantially trap free oxynitride layer of the first layer can be formed, for example, in a chemical vapor deposition (CVD) process using a process gas comprising dichlorosilane ($SiH_2Cl_2$), ammonia ($NH_3$) and nitrous oxide ($N_2O$). The oxynitride charge trapping layer can be formed, for example, in a CVD process using a process gas comprising BTBAS and $NH_3$.

In another aspect, the present invention is directed to a semiconductor device including a bilayer charge storing layer comprising a first layer including a substantially trap free oxynitride layer, and a second layer formed on a surface of the first layer including an oxynitride charge trapping layer. Preferably, the oxynitride charge trapping layer comprises a higher stoichiometric composition of silicon than the oxynitride layer of the first layer. More preferably, the oxynitride charge trapping layer comprises a predetermined concentration of carbon selected to increase the number of traps therein.

BRIEF DESCRIPTION OF THE DRAWINGS

These and various other features and advantages of the present invention will be apparent upon reading of the following detailed description in conjunction with the accompanying drawings and the appended claims provided below, where:

DETAILED DESCRIPTION

The present invention is directed generally to an oxide-nitride-oxide (ONO) structure including an oxynitride bilayer as a charge storing layer and methods for making the same. The ONO structure and method are particularly useful for forming a memory layer in a memory device, such as a silicon-oxide-nitride-oxide-silicon (SONOS) memory transistor.

In the following description, for purposes of explanation, numerous specific details are set forth in order to provide a thorough understanding of the present invention. It will be evident, however, to one skilled in the art that the present invention may be practiced without these specific details. In other instances, well-known structures, and techniques are not shown in detail or are shown in block diagram form in order to avoid unnecessarily obscuring an understanding of this description.

Reference in the description to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment. The term "to couple" as used herein may include both to directly connect and to indirectly connect through one or more intervening components.

Briefly, the method includes forming a bilayer charge storing layer including a first layer and a second layer formed on a surface of the first layer, the second layer including an oxynitride charge trapping layer. Generally, the first layer includes a substantially trap free oxynitride layer having differing concentrations of Oxygen, Nitrogen and/or Silicon than those of the oxynitride charge trapping layer. In certain embodiments, the oxynitride charge trapping layer includes a significantly higher stoichiometric composition of silicon than that of the first layer. In other embodiments, the oxynitride charge trapping layer can further include a concentration of carbon selected to increase the number of traps therein. The trap free oxynitride layer reduces stored charge loss without compromising device speed or an initial (beginning of life) difference between program and erase voltages. The oxynitride charge trapping layer increases a difference between programming and erase voltages of memory devices, thereby improving device speed, increasing data retention, and extending the operating life of the device.

Optionally, the ratio of thicknesses between the top oxynitride charge trapping layer and the trap free oxynitride layer can be selected to further improve or optimize data retention, thereby extending the operating life of the device.

An ONO structure including a bilayer charge storing layer and methods for fabricating the same according to various embodiments of the present invention will now be described in greater detail with reference to FIGS. 3 through 5.

Figure 1:
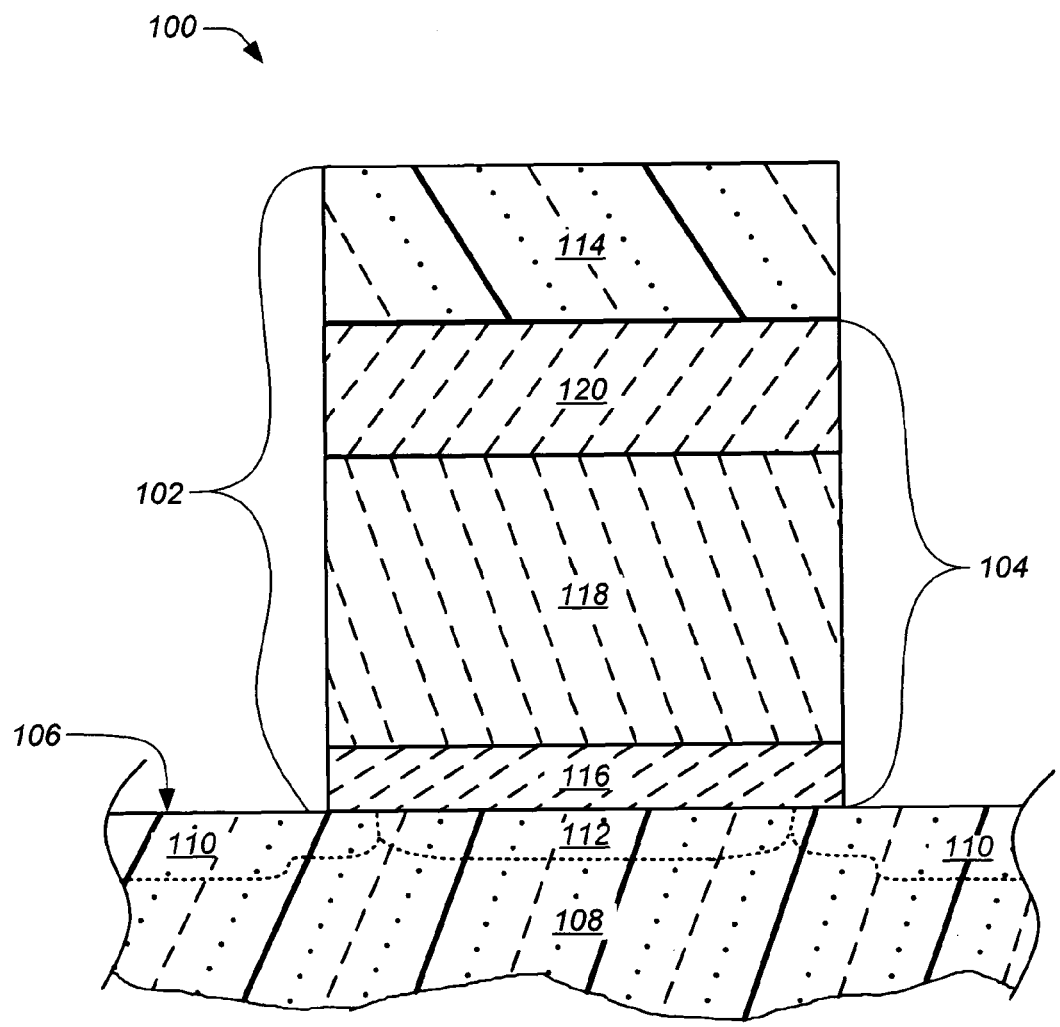
FIG. 1 is a block diagram illustrating a cross-sectional side view of an intermediate structure for a memory device for which a method including an oxide-nitride-oxide (ONO) stack formed according to conventional method.
Figure 2A:
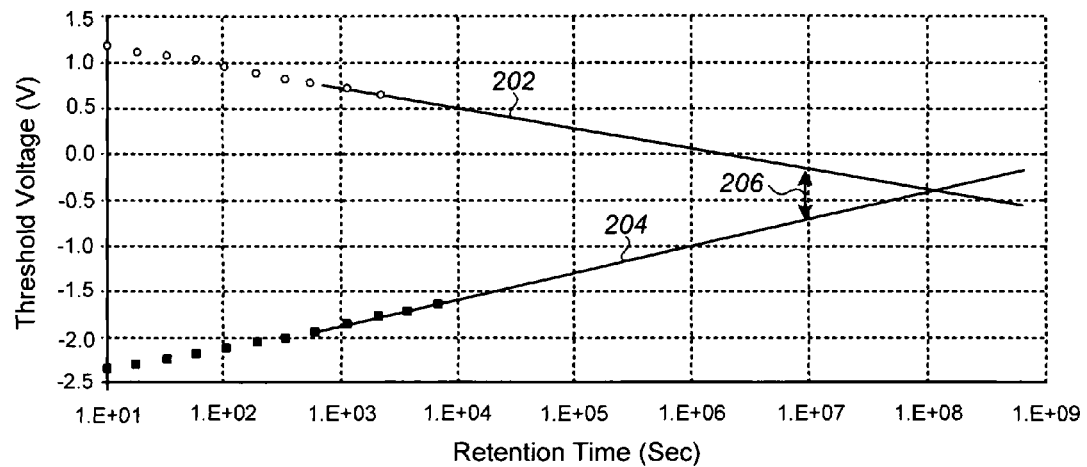
FIG. 2A is a graph showing data retention for a memory device using a memory layer formed according to a conventional method and having a large initial difference between programming and erase voltages but which loses charge quickly.
Figure 2B:
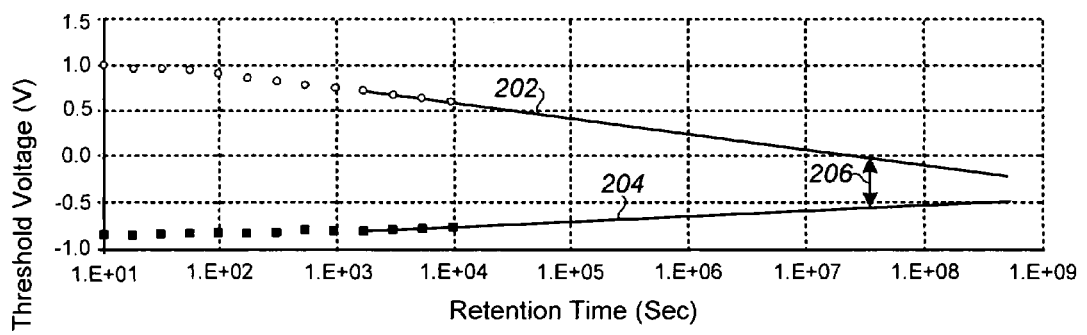
FIG. 2B is a graph showing data retention for a memory device using a memory layer formed according to a conventional method and having a smaller initial difference between programming and erase voltages.
Figure 3:
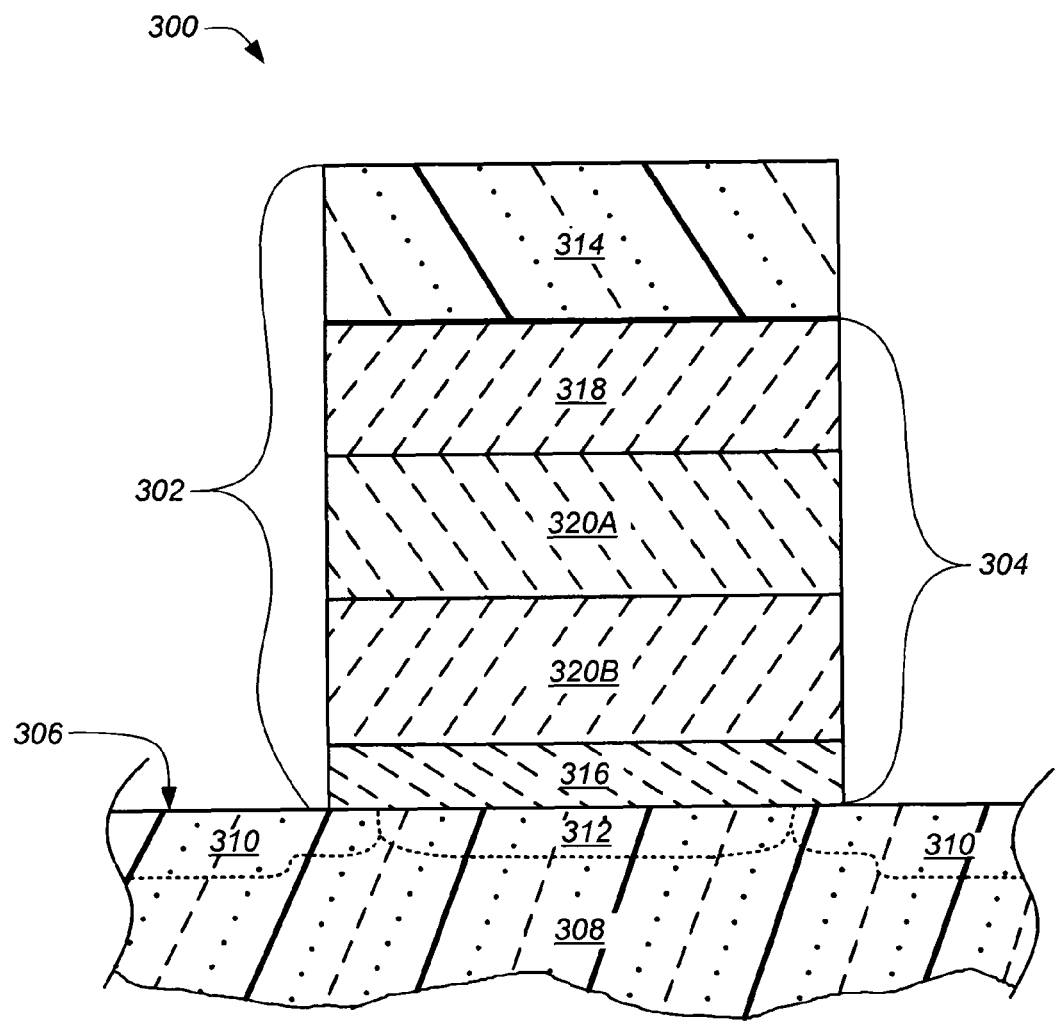
FIG. 3 is a block diagram illustrating a cross-sectional side view of a portion of a semiconductor device comprising an ONO structure including a multi-layer charge storing layer according to an embodiment of the present invention.

FIG. 3 is a block diagram illustrating a cross-sectional side view of a portion of a semiconductor memory device 300 comprising an ONO structure including a bilayer charge storing layer according to one embodiment of the present invention. Referring to FIG. 3, the memory device 300 includes a SONOS gate stack 302 including an ONO structure 304 formed over a surface 306 of a silicon layer on a substrate or a silicon substrate 308. In addition, the device 300 further includes one or more diffusion regions 310, such as source and drain regions, aligned to the gate stack 302 and separated by a channel region 312. Generally, the SONOS structure 302 includes a poly-silicon or poly gate layer 314 formed on and in contact with the ONO structure 304 and a portion of the silicon layer or substrate 308. The poly gate 314 is separated or electrically isolated from the substrate 308 by the ONO structure 304.

The ONO structure 304 includes a thin, lower oxide layer or tunneling oxide layer 316 that separates or electrically isolates the gate stack 302 from the channel region 312, a top or blocking oxide layer 318, and a bilayer charge storing layer 320. Preferably, as noted above and as shown in FIG. 3, the bilayer charge storing layer includes at least two oxynitride layers, including a top, charge trapping oxynitride layer 320A and a lower, trap free oxynitride layer 320B.

Generally, the substrate 308 may include any known silicon-based semiconductor material including silicon, silicon-germanium, silicon-on-insulator, or silicon-on-sapphire substrate. Alternatively, the substrate 308 may include a silicon layer formed on a non-silicon-based semiconductor material, such as gallium-arsenide, germanium, gallium-nitride, or aluminum-phosphide. Preferably, the substrate 308 is a doped or undoped silicon substrate.

The lower oxide layer or tunneling oxide layer 316 of the ONO structure 304 generally includes a relatively thin layer of silicon dioxide ($SiO_2$) of from about 15 angstrom (Å) to about 22 Å, and more preferably about 18 Å. The tunneling oxide layer 316 can be formed or deposited by any suitable means including, for example, being thermally grown or deposited using chemical vapor deposition (CVD). In a preferred embodiment, the tunnel oxide layer is formed or grown using a steam anneal. Generally, the process includes a wet-oxidizing method in which the substrate 308 is placed in a in a deposition or processing chamber, heated to a temperature from about 700° C. to about 850° C., and exposed to a wet vapor for a predetermined period of time selected based on a desired thickness of the finished tunneling oxide layer 316. Exemplary process times are from about 5 to about 20 minutes. The oxidation can be performed at atmospheric or at low pressure.

The bilayer charge storing layer generally includes at least two oxynitride layers formed or deposited in separate steps utilizing different processes and process gases or source materials, and have an overall or combined thickness of from about 70 Å to about 150 Å, and more preferably about 100 Å.

In a preferred embodiment, the lower, trap free oxynitride layer 320B is deposited in a low pressure CVD process using a process gas including a silicon source, such as silane ($SiH_4$), chlorosilane ($SiH_3Cl$), dichlorosilane ($SiH_2Cl_2$), tetrachlorosilane ($SiCl_4$), a nitrogen source, such as nitrogen ($N_2$), ammonia ($NH_3$), nitrogen trioxide ($NO_3$) or nitrous oxide ($N_2O$), and an oxygen-containing gas, such as oxygen ($O_2$) or $N_2O$. For example, in one embodiment the trap free oxynitride layer 320B is deposited in a low pressure CVD process using a process gas including dichlorosilane, $NH_3$ and $N_2O$, while maintaining the chamber at a pressure of from about 5 millitorr (mT) to about 500 mT, and maintaining the substrate at a temperature of from about 700° C. to about 850° C. and more preferably at least about 780° C., for a period of from about 2.5 minutes to about 20 minutes. In particular, the process gas can include a first gas mixture of $N_2O$ and $NH_3$ mixed in a ratio of from about 8:1 to about 1:8 and a second gas mixture of DCS and $NH_3$ mixed in a ratio of from about 1:7 to about 7:1, and can be introduced at a flow rate of from about 5 to about 200 standard cubic centimeters per minute (sccm).

Alternatively, gases in which hydrogen has been replaced by deuterium can be used, including, for example, the substitution of deuterated-ammonia ($ND_3$) for $NH_3$. The substitution of deuterium for hydrogen advantageously passivates Si dangling bonds at the silicon-oxide interface, thereby increasing an NBTI (Negative Bias Temperature Instability) lifetime of the devices.

The top, charge trapping oxynitride layer 320A can be deposited over the bottom oxynitride layer 320B in a CVD process using a process gas including Bis-TertiaryButylAminoSilane (BTBAS). It has been found that the use of BTBAS increases the number of deep traps formed in the oxynitride by increasing the carbon level in the charge trapping oxynitride layer 320A. Moreover, these deep traps reduce charge losses due to thermal emission, thereby further improving data retention. More preferably, the process gas includes BTBAS and ammonia ($NH_3$) mixed at a predetermined ratio to provide a narrow band gap energy level in the oxynitride charge trapping layer. In particular, the process gas can include BTBAS and $NH_3$ mixed in a ratio of from about 7:1 to about 1:7. For example, in one embodiment the charge trapping oxynitride layer 320A is deposited in a low pressure CVD process using BTBAS and ammonia $NH_3$ at a chamber pressure of from about 5 mT to about 500 mT, and at a substrate temperature of from about 700° C. to about 850° C. and more preferably at least about 780° C., for a period of from about 2.5 minutes to about 20 minutes.

It has been found that an oxynitride layer produced or deposited under the above conditions yields a trap-rich oxynitride layer 320A, which improves the program and erase speed and increases of the initial difference (window) between program and erase voltages without compromising a charge loss rate of memory devices made using an embodiment of the inventive ONO structure 304, thereby extending the operating life (EOL) of the device. Preferably, the charge trapping oxynitride layer 320A has a charge trap density of at least about $1E10/cm^2$, and more preferably from about $1E12/cm^2$ to about $1E14/cm^2$.

Alternatively, the charge trapping oxynitride layer 320A can be deposited over the bottom oxynitride layer 320B in a CVD process using a process gas including BTBAS and substantially not including ammonia ($NH_3$). In this alternative embodiment of the method, the step of depositing the top, charge trapping oxynitride layer 320A is followed by a thermal annealing step in a nitrogen atmosphere including nitrous oxide ($N_2O$), $NH_3$, and/or nitrogen oxide (NO).

Preferably, the top, charge trapping oxynitride layer 320A is deposited sequentially in the same CVD tool used to form the bottom, trap free oxynitride layer 320B, substantially without breaking vacuum on the deposition chamber. More preferably, the charge trapping oxynitride layer 320A is deposited substantially without altering the temperature to which the substrate 308 was heated during deposition of the trap free oxynitride layer 320B.

In certain embodiments, another oxide or oxide layer (not shown in these figures) is formed after the formation of the ONO structure 304 in a different area on the substrate or in the device using a steam oxidation. In this embodiment, the top, charge trapping oxynitride layer 320A and top oxide layer 318 of the ONO structure 304 are beneficially steam annealed during the steam oxidation process. In particular, steam annealing improves the quality of the top oxide layer 318 reducing the number of traps formed near a top surface of the top oxide layer and near a top surface of the underlying charge trapping oxynitride layer 320A, thereby reducing or substantially eliminating an electric field that could otherwise form across the top oxide layer, which could result in back streaming of charge carriers there through and adversely affecting data or charge retention in the charge storing layer.

A suitable thickness for the lower, trap free oxynitride layer 320B has been found to be from about 10 Å to about 80 Å, and a ratio of thicknesses between the bottom layer and the top, charge trapping oxynitride layer has been found to be from about 1:6 to about 6:1, and more preferably at least about 1:4.

The top oxide layer 318 of the ONO structure 304 includes a relatively thick layer of $SiO_2$ of from about 30 Å to about 70 Å, and more preferably about 45 Å. The top oxide layer 318 can be formed or deposited by any suitable means including, for example, being thermally grown or deposited using CVD. In a preferred embodiment, the top oxide layer 318 is a high-temperature-oxide (HTO) deposited using CVD process. Generally, the deposition process includes exposing the substrate 308 to a silicon source, such as silane, chlorosilane, or dichlorosilane, and an oxygen-containing gas, such as $O_2$ or $N_2O$ in a deposition chamber at a pressure of from about 50 mT to about 1000 mT, for a period of from about 10 minutes to about 120 minutes while maintaining the substrate at a temperature of from about 650° C. to about 850° C.

Preferably, the top oxide layer 318 is deposited sequentially in the same tool used to form the oxynitride layers 320A, 320B. More preferably, the oxynitride layers 320A, 320B, and the top oxide layer 318 are formed or deposited in the same tool used to grow the tunneling oxide layer 316. Suitable tools include, for example, an ONO AVP, commercially available from AVIZA technology of Scotts Valley, Calif.

A method or forming or fabricating an ONO stack according to one embodiment of the present invention is now described with reference to the flowchart of FIG. 4.

Figure 4:
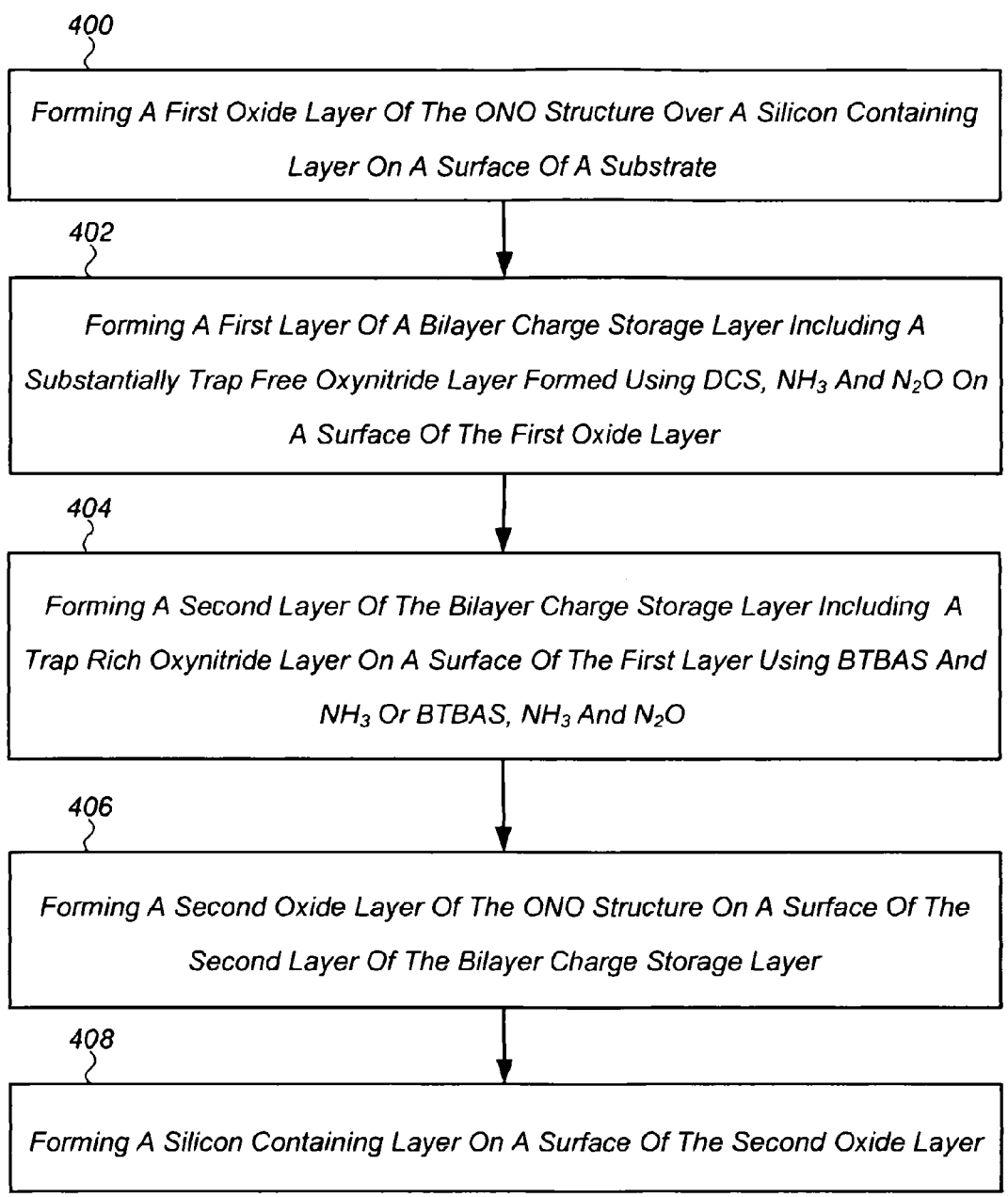
FIG. 4 is flow chart of a method for forming an ONO structure including a multi-layer charge storing layer according to an embodiment of the present invention.

Referring to FIG. 4, the method begins with forming a first oxide layer, such as a tunneling oxide layer, of the ONO structure over a silicon containing layer on a surface of a substrate (step 400). Next, the first layer of a bilayer charge storing layer including a first, substantially trap free oxynitride layer is formed on a surface of the first oxide layer using DCS, $NH_3$ and $N_2O$ (step 402). As noted above, this oxynitride layer can be formed or deposited by a low pressure CVD process using a process gas including dichlorosilane, $NH_3$ and $N_2O$, to provide a high quality oxynitride layer. The second layer of the bilayer charge storing layer including a trap rich oxynitride layer is then formed on a surface of the first layer of the bilayer using BTBAS and $NH_3$ or BTBAS, $NH_3$ and $N_2O$ (step 404). This second oxynitride layer has a stoichiometric composition of oxygen, nitrogen and/or silicon different from that of the first oxynitride layer. In particular, and as noted above, the oxynitride layer of the second or top layer of the bilayer can be formed or deposited by a CVD process using a process gas CVD process using BTBAS and $NH_3$ in a mixture and at flow rates tailored to provide a silicon-rich oxynitride layer. Finally, a second oxide layer of the ONO structure is formed on a surface of the second layer of the bilayer charge storing layer (step 406). As noted above, this top or blocking oxide layer can be formed or deposited by any suitable means, but is preferably deposited in a CVD process. In one embodiment the top or second oxide layer is a high temperature oxide deposited in a HTO CVD process. Alternatively, the top or blocking oxide layer can be thermally grown, however it will be appreciated that in this embodiment the oxynitride thickness must be adjusted or increased as some of the top oxynitride will be effectively consumed or oxidized during the process of thermally growing the blocking oxide layer.

Optionally, the method may further include the step of forming or depositing a silicon containing layer on a surface of the second oxide layer to form a SONOS stack or structure (step 408). The silicon containing layer can include, for example, a polysilicon layer deposited by a CVD process to form a control gate of a SONOS transistor or device.

A comparison of data retention for a memory device using a memory layer formed according to an embodiment of the present invention as compared to a memory device using a conventional memory layer will now be made with reference to FIG. 5. In particular, FIG. 5 illustrates the change in threshold voltage of devices in an electronically erasable programmable read-only memory (EEPROM) during programming (VTP) during erase (VTE) over device life for an EEPROM made using a conventional ONO structure and an ONO structure including a multi-layer oxynitride layer. In gathering data for this figure both devices were pre-cycled for 100K cycles at an ambient temperature of 85° C.

Figure 5:
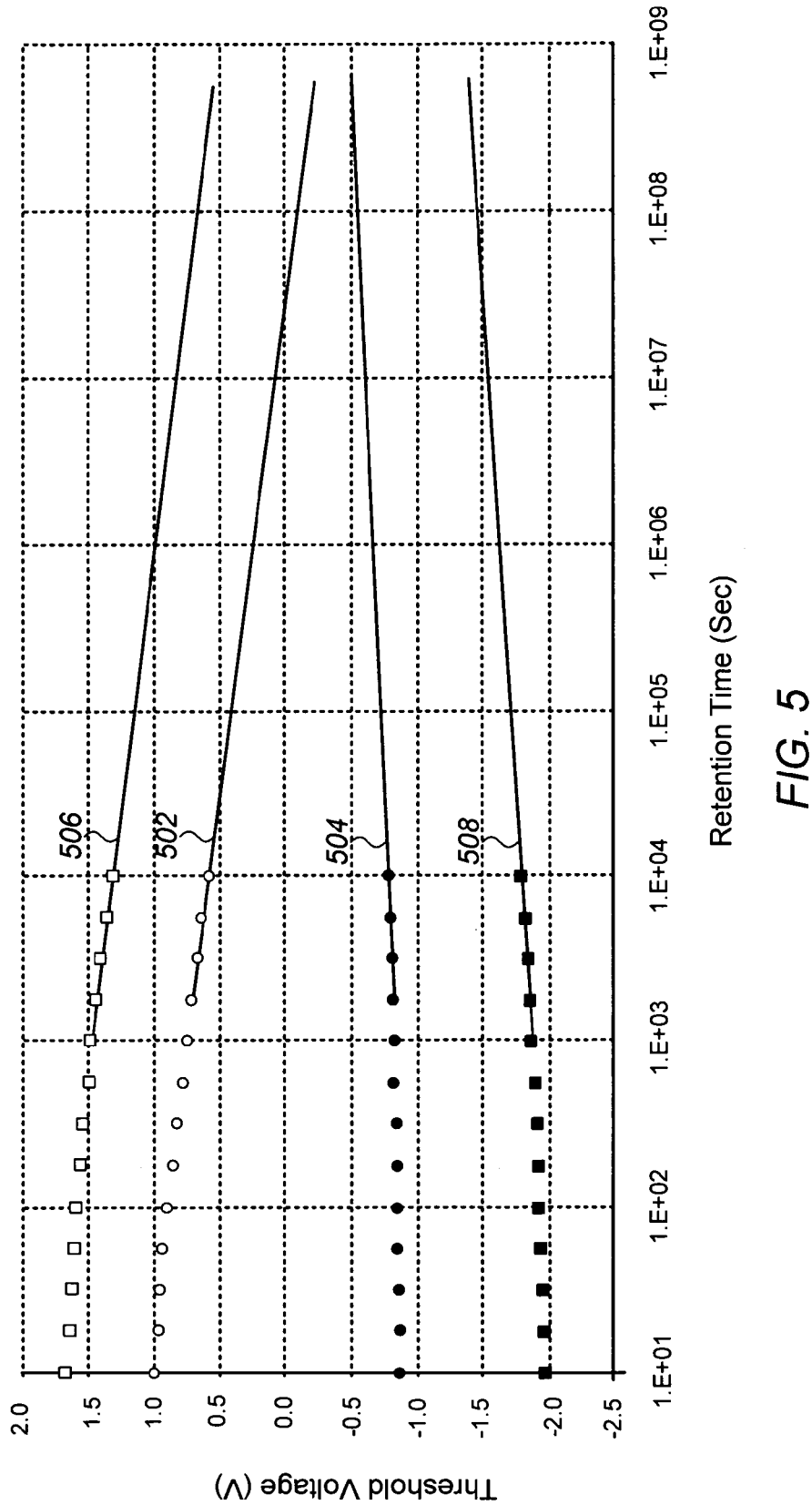
FIG. 5 is a graph showing an improvement in data retention for a memory device using a memory layer formed according to the present invention as compared to a memory device using a conventional memory layer.

Referring to FIG. 5, the graph or line 502 illustrates the change over time of a VTP for an EEPROM made using a conventional ONO structure including a single oxynitride layer without refreshing the memory after the initial writing—program or erase. Actual data points on line 502 are shown by unfilled circles, the remainder of the line showing an extrapolation of VTP to a specified end-of-life (EOL) for the EEPROM. Graph or line 504 illustrates the change over time of a VTE for the EEPROM made using a conventional ONO structure. Actual data points on line 504 are shown by filled circles, and the remainder of the line shows an extrapolation of VTE to EOL for the EEPROM. Generally, the specified difference between the VTE and VTP for an EEPROM at EOL is at least 0.5 V to be able to identify or sense the difference between the program and erase state. As seen from this figure an EEPROM made using a conventional ONO structure has a difference between VTE and VTP of about 0.35V at a specified EOL of 20 years. Thus, an EEPROM made using a conventional ONO structure and operated under the conditions described above will fail to meet the specified operating life of at least about 17 years.

In contrast, the change in VTP and VTE over time for an EEPROM made using an ONO structure including a multi-layer oxynitride layer, illustrated by lines 506 and 508 respectively, shows a difference between VTE and VTP of at least about 1.96V at the specified EOL. Thus, an EEPROM made using an ONO structure according to an embodiment of the present invention will meet and exceed the specified operating life of 20 years. In particular, graph or line 506 illustrates the change over time of VTP for an EEPROM using an ONO structure according to an embodiment of the present invention. Actual data points on line 506 are shown by unfilled squares, the remainder of the line showing an extrapolation of VTP to the specified EOL. Graph or line 508 illustrates the change over time of VTE for the EEPROM, and actual data points on line 508 are shown by filled squares, the remainder of the line showing an extrapolation of VTE to EOL.

Although shown and described above as having only two oxynitride layers, i.e., a top and a bottom layer, the present invention is not so limited, and the multi-layer charge storing layer can include any number, n, of oxynitride layers, any or all of which may have differing stoichiometric compositions of oxygen, nitrogen and/or silicon. In particular, multi-layer charge storing layers having up to five oxynitride layers each with differing stoichiometric compositions have been produced and tested. However, as will be appreciated by those skilled in the art it is generally desirable to utilize as few layers as possible to accomplish a desired result, reducing the process steps necessary to produce the device, and thereby providing a much simpler and more robust manufacturing process. Moreover, utilizing as few layers as possible also results in higher yields as it is simpler to control the stoichiometric composition and dimensions of the fewer layers.

It will further be appreciated that although shown and described as part of a SONOS stack in a SONOS memory device, the ONO structure and method of the present invention is not so limited, and the ONO structure can be used in or with any semiconductor technology or in any device requiring a charge storing or dielectric layer or stack including, for example, in a split gate flash memory, a TaNOS stack, in a 1T (transistor) SONOS cell, a 2T SONOS cell, a 3T SONOS cell, a localized 2-bit cell, and in a multilevel programming or cell, without departing from the scope of the invention.

The advantages of ONO structures and methods of forming the same according to an embodiment of the present invention over previous or conventional approaches include: (i) the ability to enhance data retention in memory devices using the structure by dividing the oxynitride layer into a plurality of films or layers and tailoring the oxygen, nitrogen and silicon profile across each layer; (ii) the ability to enhance speed of a memory device without compromising data retention; (iii) the ability to meet or exceed data retention and speed specifications for memory devices using an ONO structure of an embodiment of the present invention at a temperature of at least about 125° C.; and (iv) provide heavy duty program erase cycles of 100,000 cycles or more.

The foregoing description of specific embodiments and examples of the invention have been presented for the purpose of illustration and description, and although the invention has been described and illustrated by certain of the preceding examples, it is not to be construed as being limited thereby. They are not intended to be exhaustive or to limit the invention to the precise forms disclosed, and many modifications, improvements and variations within the scope of the invention are possible in light of the above teaching. It is intended that the scope of the invention encompass the generic area as herein disclosed, and by the claims appended hereto and their equivalents. The scope of the present invention is defined by the claims, which includes known equivalents and unforeseeable equivalents at the time of filing of this application.

What is claimed is:

1. A method of forming a bilayer charge storing layer of a semiconductor device, the method comprising steps of:
   forming a first layer of the bilayer charge storing layer; and
   forming a second layer formed on a surface of the first layer, the second layer including an oxynitride charge trapping layer having a predetermined concentration of carbon selected to increase the number of traps therein.

2. A method according to claim 1, wherein the step of forming the first layer comprises the step of forming a first layer including a substantially trap free oxynitride layer.

3. A method according to claim 2, wherein the step of forming the second layer comprises the step of forming an oxynitride charge trapping layer having a higher stoichiometric composition of silicon than the oxynitride layer of the first layer.

4. A method of forming a bilayer charge storing layer of a semiconductor device, the method comprising steps of:
   forming a first layer of the bilayer charge storing layer; and
   forming a second layer formed on a surface of the first layer, the second layer including an oxynitride charge trapping layer formed in a chemical vapor deposition (CVD) process using a process gas comprising Bis-TertiaryButylAminoSilane (BTBAS) and ammonia (NH3).

5. A method according to claim 4, wherein the oxynitride charge trapping layer is formed using a process gas comprising BTBAS and NH3 mixed at a predetermined ratio to provide a narrow band gap energy level in the oxynitride charge trapping layer.

6. A method of forming a bilayer charge storing layer of a semiconductor device, the method comprising steps of:
   forming a first layer of the bilayer charge storing layer; and
   forming a second layer formed on a surface of the first layer, the second layer including an oxynitride charge trapping layer formed in a chemical vapor deposition (CVD) process using a process gas comprising Bis-TertiaryButylAminoSilane (BTBAS) and substantially not including ammonia (NH3).

7. A method according to claim 6, wherein the deposition of the oxynitride charge trapping layer is followed by a thermal annealing step in an atmosphere comprising gases selected from the group consisting of nitrous oxide (N2O), NH3, and nitrogen oxide (NO).

8. A method of forming an oxide-nitride-oxide (ONO) structure of a semiconductor device, the method comprising steps of:
   forming a first oxide layer of the ONO structure;
   forming a bilayer charge storing layer on a surface of the first oxide layer, the bilayer charge storing layer including a first layer including a substantially trap free oxynitride layer formed in a chemical vapor deposition (CVD) process using a process gas comprising dichlorosilane (SiH2Cl2), ammonia (NH3) and nitrous oxide (N2O) and a second layer formed on a surface of the first layer including an oxynitride charge trapping layer; and
   forming a second oxide layer of the ONO structure on a surface of the second layer.

9. A method according to claim 8, wherein the oxynitride charge trapping layer comprises a higher stoichiometric composition of silicon than the oxynitride layer of the first layer.

10. A method according to claim 8, wherein the step of forming a bilayer charge storing layer comprises the step of forming an oxynitride layer of the first layer and an oxynitride charge trapping layer having a predetermined ratio of thicknesses there between.

11. A method according to claim 8, wherein the oxynitride charge trapping layer comprises a predetermined concentration of carbon selected to increase the number of traps therein.

12. A method according to claim 8, wherein the oxynitride charge trapping layer is formed in a chemical vapor deposition (CVD) process using a process gas comprising Bis-TertiaryButylAminoSilane (BTBAS) and ammonia (NH3).

13. A method according to claim 8, wherein the oxynitride charge trapping layer is formed in a chemical vapor deposition (CVD) process using a process gas comprising Bis-TertiaryButylAminoSilane (BTBAS) and substantially not including ammonia (NH3).

14. A method according to claim 13, wherein the deposition of the oxynitride charge trapping layer is followed by a thermal annealing step in an atmosphere comprising gases selected from the group consisting of nitrous oxide (N2O), NH3, and nitrogen oxide (NO).

15. A semiconductor device including bilayer charge storing layer comprising:
   a first layer including a substantially trap free oxynitride layer; and
   a second layer formed on a surface of the first layer including an oxynitride charge trapping layer including a predetermined concentration of carbon selected to increase the number of traps therein.

16. A semiconductor device according to claim 15, wherein the oxynitride charge trapping layer comprises a higher stoichiometric composition of silicon than the oxynitride layer of the first layer.

17. A semiconductor device according to claim 15, wherein the oxynitride layer of the first layer and the oxynitride charge trapping layer have a predetermined ratio of thicknesses there between.

* * * * *